US006839009B1

(12) United States Patent
Ali (10) Patent No.: US 6,839,009 B1
(45) Date of Patent: Jan. 4, 2005

(54) ANALOG-TO-DIGITAL CONVERTER METHODS AND STRUCTURES FOR INTERLEAVABLY PROCESSING DATA SIGNALS AND CALIBRATION SIGNALS

(75) Inventor: Ahmed Mohamed Abdelatty Ali, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/622,989

(22) Filed: Jul. 18, 2003

(51) Int. Cl.[7] .............................................. H03M 1/12
(52) U.S. Cl. ...................................... 341/118; 341/172
(58) Field of Search ................................ 341/118, 120, 341/155, 172

(56) References Cited

U.S. PATENT DOCUMENTS

| 5,929,796 | A | * | 7/1999 | Opris et al. .................. 341/120 |
| 6,140,948 | A | * | 10/2000 | Yu .............................. 341/118 |
| 6,169,502 | B1 | * | 1/2001 | Johnson et al. ............. 341/120 |
| 6,184,809 | B1 | | 2/2001 | Yu .............................. 341/120 |
| 6,456,223 | B1 | | 9/2002 | Yu .............................. 341/161 |
| 6,496,125 | B2 | | 12/2002 | Jonsson et al. ............. 341/118 |
| 6,563,445 | B1 | | 5/2003 | Sabouri ....................... 341/120 |

OTHER PUBLICATIONS

Moon, U.K., et al., "Background Digital Calibration Techniques for Pipelined ADC's", IEEE Transactions on Circuits and Systems–II, 44(2), pp. 102–109, Feb., 1997.
Lee, H. S., "A 12–b 600 ks/s Digitally Self–Calibrated Pipelined Algorithmic ADC", IEEE J. Solid–State Circuits, 29, pp. 509–515, Apr., 1994.

* cited by examiner

Primary Examiner—Howard L. Williams
(74) Attorney, Agent, or Firm—Koppel, Jacobs, Patrick & Heybl (57) ABSTRACT

Methods and structures are provided for the interleaved calibration and subsequent correction of errors in switched-capacitor converter stages of pipelined analog-to-digital converters. The interleaved calibration can be run continuously or at selected times without disturbing the ongoing processing of input data signals. With first and second sets of capacitors, converter stages interleavably process input data signals and input calibration signals. Once these stages have been calibrated with their second sets of capacitors, the first and second sets are exchanged and the converter stages subsequently process input data signals with their second sets of capacitors.

28 Claims, 6 Drawing Sheets

ANALOG-TO-DIGITAL CONVERTER METHODS AND STRUCTURES FOR INTERLEAVABLY PROCESSING DATA SIGNALS AND CALIBRATION SIGNALS

BACKGROUND OF THE INVENTION

1. Field of the Invention

The present invention relates generally to pipelined analog-to-digital converters.

2. Description of the Related Art

A variety of modern electronic systems (e.g., scanners, camcorders, communication modems, medical image processors and high-definition television) require high-speed signal conditioning which has been effectively provided with pipelined analog-to-digital converters whose multiple converter stages provide conversion speeds that typically exceed those of other converter structures.

An important class of pipelined analog-to-digital converters is realized with converter stages that each use a switched-capacitor structure to process a respective input data signal and generate a succeeding input data signal for a succeeding converter stage. It has been found that gain and offset errors in these switched-capacitor structures introduce nonlinearities into the pipelined converter's transfer function.

These errors have generally been addressed with calibration techniques that typically require interruption of the data signal processing and/or require the addition of specific calibration structures (e.g., an additional converter stage) with consequent degradation of converter parameters (e.g., size, power consumption and cost).

BRIEF SUMMARY OF THE INVENTION

The present invention is directed to methods and structures for interleavably processing data signals and calibration signals in pipelined analog-to-digital converter stages. With no disruption of signal processing and with minimal increase in power consumption and circuit space, these interleaved methods and structures correct for multiplying digital-to-analog converter errors in the converter stages. The novel features of the invention are set forth with particularity in the appended claims. The invention will be best understood from the following description when read in conjunction with the accompanying drawings.

DETAILED DESCRIPTION OF THE INVENTION

Figure 1:
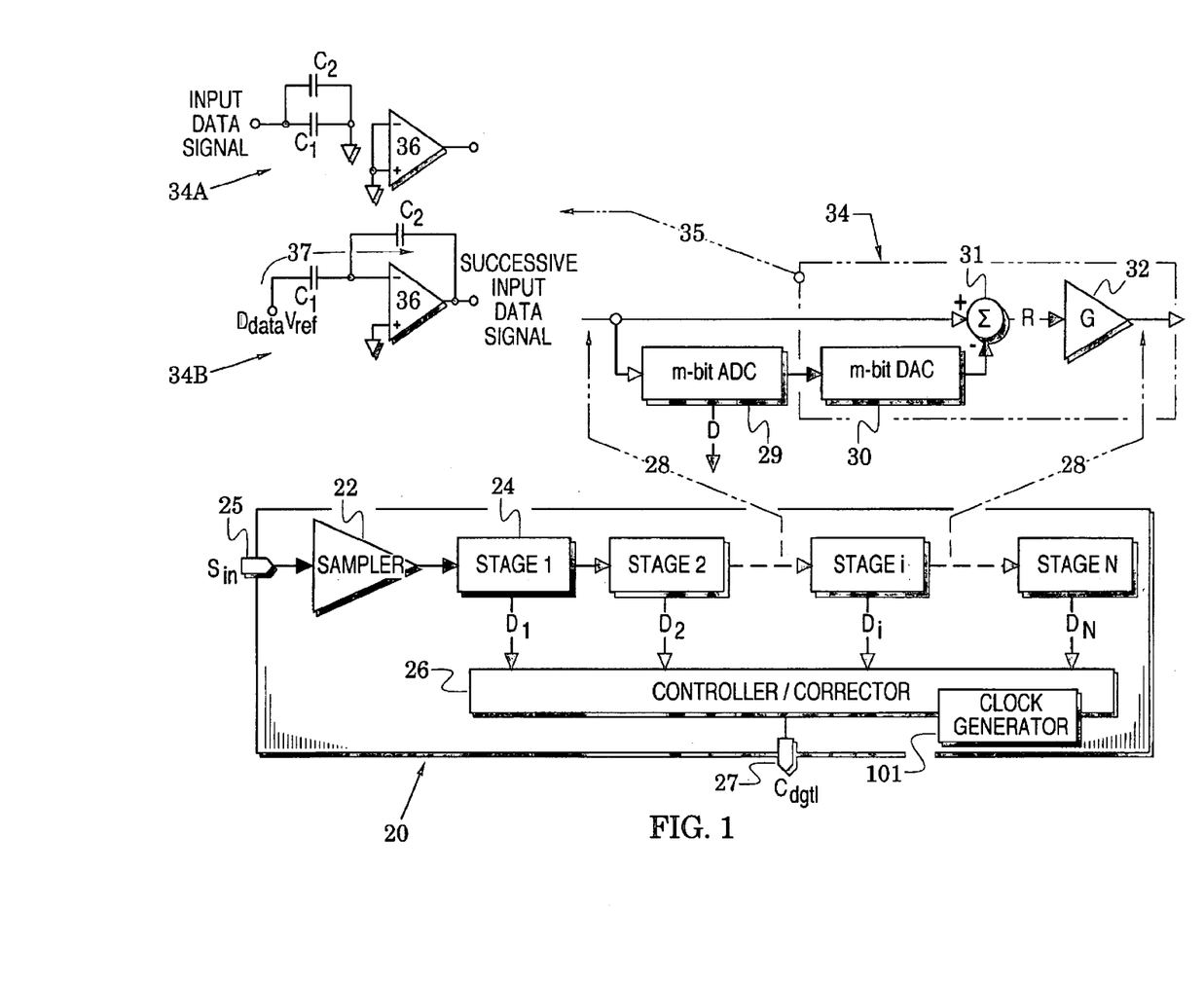
FIG. 1 is a block diagram of a pipelined ADC system of the present invention.

FIG. 1 illustrates a pipelined ADC system 20 of the present invention which includes converter structures that provide for the interleaved calibration and subsequent correction of converter stages. Each converter stage (except generally the Nth Stage) includes a multiplying digital-to-analog converter (MDAC) and the interleaved calibration corrects for MDAC errors which generally include digital-to-analog converter (DAC) errors and gain errors (due, for example, to capacitor mismatch, finite amplifier gain, element aging, temperature changes and ringing on circuit lines). The interleaved calibration can be run continuously or at selected times without disturbing the ongoing processing of input data signals.

In particular, the system 20 includes a sampler 22 and N converter stages 24 coupled in a successive pipelined arrangement. The sampler provides samples of an input data signal $S_{in}$ at an input port 25 and each converter stage converts a respective input data signal to a corresponding data digital code $D_N$. Each converter stage also generates a succeeding input data signal which it provides to a succeeding converter stage. The succeeding input data signal is sometimes referred to as a residue signal because it is the residue of the input data signal $S_{in}$ that has not yet been converted to a corresponding data digital code.

All converter stages, therefore, simultaneously convert respective input data signals to corresponding data digital codes but at any given moment, each converter stage is processing the residue of a different one of the input data signals $S_{in}$ that entered the system input port 25. That is, successive portions of each input data signal $S_{in}$ are successively converted in the system's converter stages. The corresponding data digital codes from the stages are received and aligned in a controller/corrector 26 which assembles them and provides a final data digital code $C_{dgtl}$ at an output port 27 that corresponds to the original input data signal $S_{in}$.

An exemplary converter stage is expanded by expansion lines 28 to show that it includes an m-bit ADC 29, an m-bit DAC 30, a summer 31 and an amplifier 32. The ADC 29 converts this stage's input data signal into a corresponding data digital code D and the DAC 30 converts this digital code to a corresponding analog signal which is provided to the summer 31 where it is subtracted from this stage's input data signal to provide a residue signal R. The residue signal is gained up in the amplifier 32 to provide the successive input data signal for the successive converter stage.

The invention realizes the structure within the broken lines 34 as a multiplying digital-to-analog converter (MDAC) 34 which is indicated by the indication line 35. Although the MDAC structures of the invention are directed to any number of bits m, the MDAC 34 is shown, for simplicity, in a version suitable for providing 1.5 bits of data digital code per converter stage. The MDAC 34 includes first and second switched capacitors $C_1$ and $C_2$ and a differential amplifier 36 wherein the first and second capacitors $C_1$ and $C_2$ are preferably matched, i.e., their capacitances are equal.

In a first operational phase shown as 34A, both capacitors are switched to thereby receive an electrical charge from their converter stage's input data signal. In a second operational phase shown as 34A, they are switched to place the second capacitor $C_2$ about the amplifier 36 to receive at least part of the electrical charge of the first capacitor $C_1$.

The DAC 30 responds to decisions of the ADC 29 (for simplicity of illustration, the DAC 30 is not shown in the first and second operational phases 34 A and B) and provides a data decision signal $D_{data}V_{ref}$ (wherein $V_{ref}$ represents plus and minus limits of the input data signal) to one end of the first capacitor $C_1$. This causes the first capacitor $C_1$ to transfer electrical charge 37 to the second capacitor $C_2$ (because of the gain of the amplifier 36, the other end of the first capacitor $C_1$ is substantially at ground) and thereby generate the successive input data signal for the successive converter stage. The MDAC 34 thus capacitively multiplies the input data signal to generate the successive input data signal.

The transfer function of the MDAC 34 is $$G(\text{input data signal} - D_{data}V_{ref}/2) \quad (1)$$

in which $G = G_c/(1 + G_c/A)$ and wherein $G_c = (C_1 + C_2)/C_2$. If the capacitors are matched and the gain of the amplifier 36 is infinite, the successive input data signal provided to a successive converter stage is $$2(\text{input data signal}) - D_{data}V_{ref} \quad (2)$$

However, gain errors in the MDAC 34 will produce a different transfer function and these errors will be passed along in the successive input data signal. In addition, errors in the DAC 30 will disturb the transfer function (e.g., introduce offsets).

In accordance with the present invention, interleave methods and structures are provided which enable the controller/corrector 26 to not only correct for decision errors in the stage's ADC 29, but to also calibrate out MDAC errors that result from gain errors and DAC errors.

Figure 2:
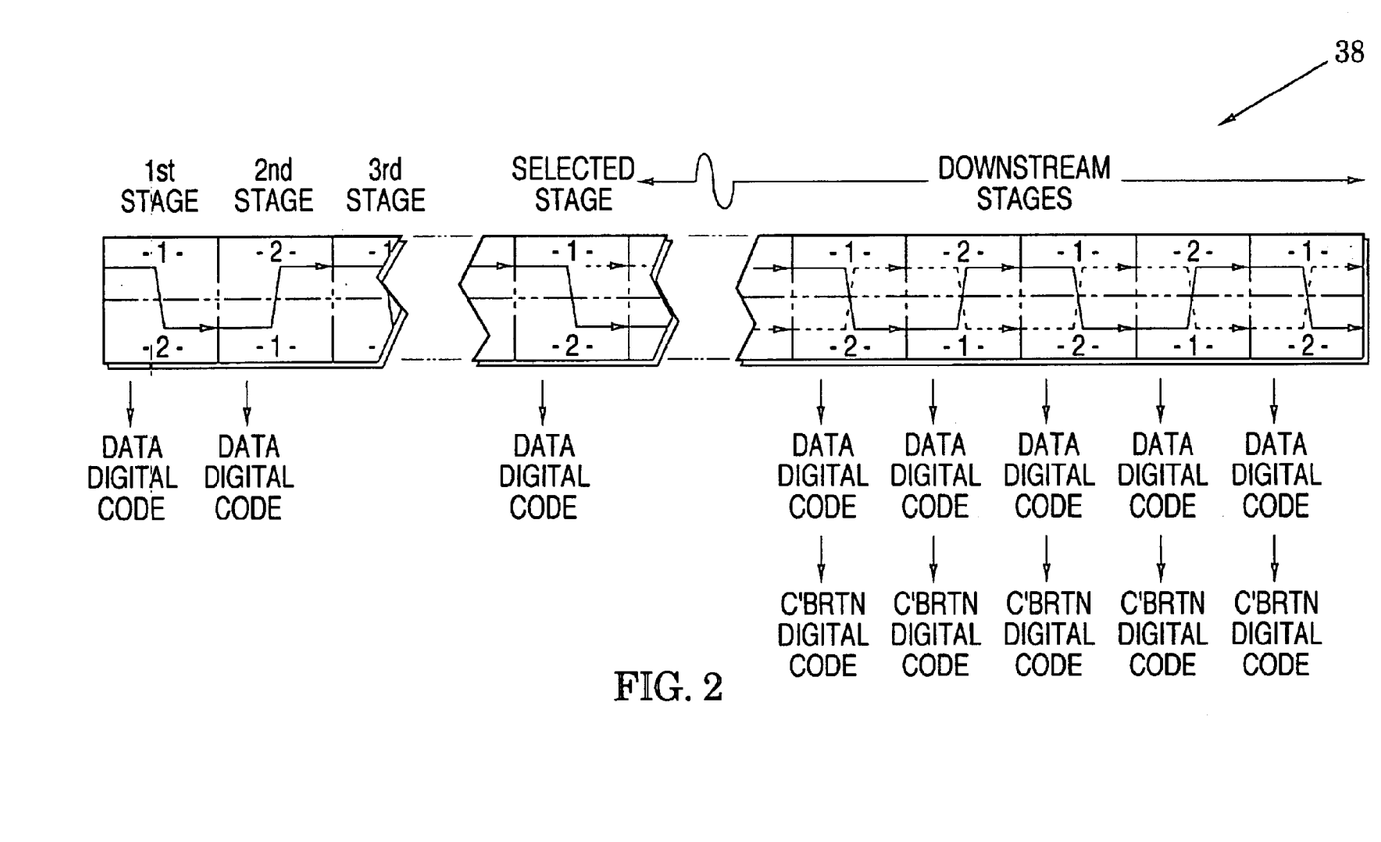
FIG. 2 is a schematic diagram that illustrates interleaved processes in the system of FIG. 1.

These methods are introduced in the diagram 38 of FIG. 2, which schematically illustrates the converter stages of FIG. 1. As indicated by - 1 - and - 2 - designations vertically spaced from a horizontal broken line, each stage temporally operates in first and second successive operational phases. In addition, the first and second operational phases of each converter stage temporally coincide with the second and first operational phases of its preceding converter stage and its succeeding converter stage.

As indicated by solid-line arrows, each converter stage employs a first set of switched capacitors to initially receive a data signal in its first operational phase and provide a corresponding data digital code. In its succeeding second operational phase, each converter stage then provides a data signal to its succeeding converter stage. Thus, each converter stage generates data digital code which can then be aligned and corrected to provide the digital code 27 of FIG. 1.

As shown by a broken-line arrow in a selected converter stage, an initial calibration signal is generated with a second set of switched capacitors. This generation is interleaved with the processing of data signals.

With second sets of switched capacitors in downstream converter stages that are downstream from the selected converter stage and in response to the initial calibration signal, downstream calibration signals are interleavably processed with the data signals to provide corresponding calibration digital codes (abbreviated as c'brtn digital code in FIG. 2). This interleaved processing of calibration signals is indicated with broken-line arrows.

Each of the downstream converter stages thus receives a calibration signal in its second operational phase and provides a corresponding calibration digital code which essentially digitizes a portion of the initial calibration signal of the selected converter stage.

In its succeeding second operational phase, each converter stage then provides a calibration signal to its succeeding converter stage.

The controller/corrector 26 of FIG. 1 can then compare the calibration digital codes to expected digital codes to thereby generate calibration coefficients for the selected converter stage that correspond to its second set of switched capacitors. Subsequently, the first and second sets of switched capacitors can be exchanged in the selected converter stage so that MDAC errors of this stage are corrected with the calibration coefficients which are preferably stored in the controller/corrector 26. The processes schematically illustrated in FIG. 2 can then be applied to converter stages that precede the selected converter stage.

Figure 3:
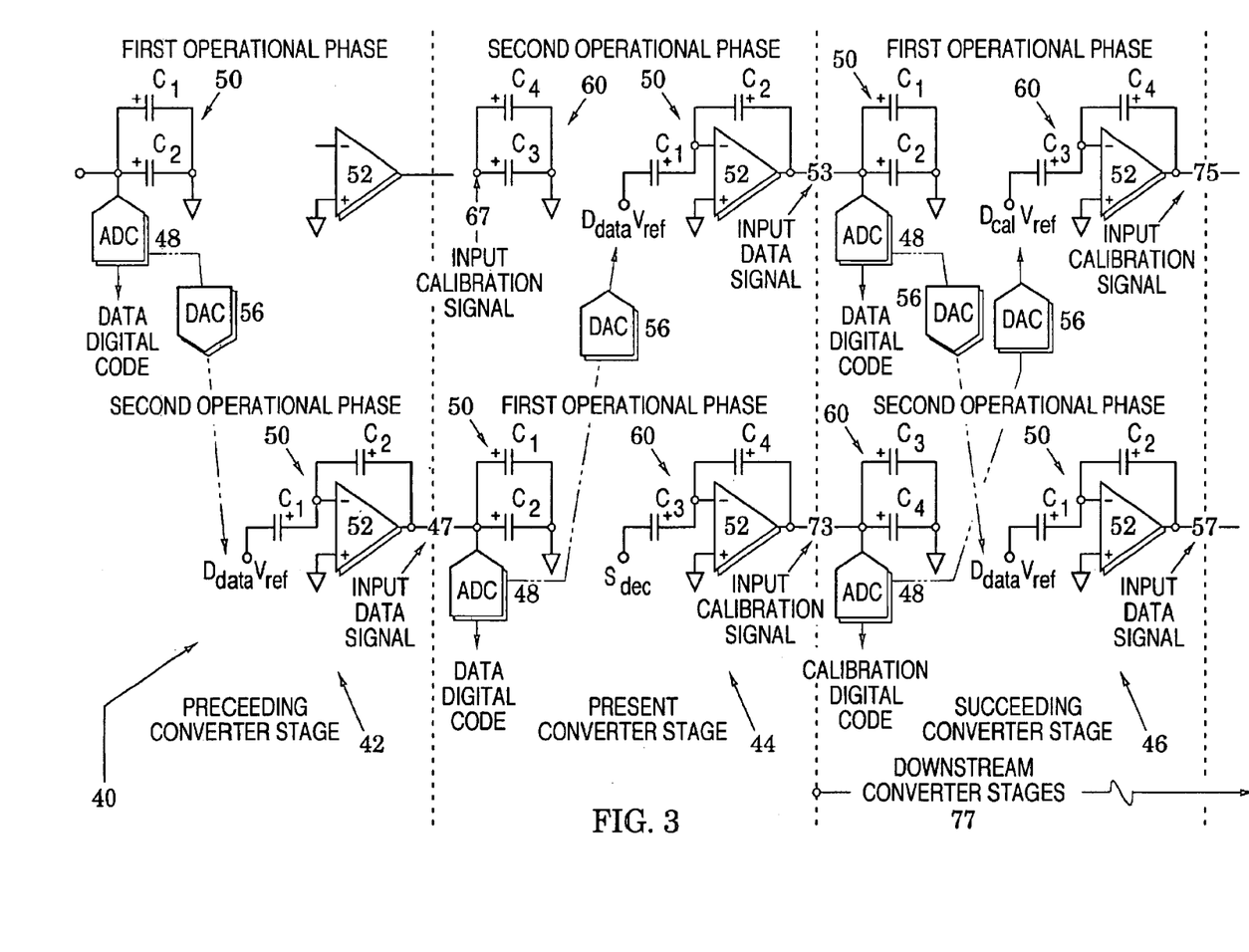
FIG. 3 is a block diagram of successive converter stages and operational phases in the system of FIG. 1.

The interleave structures of the invention are illustrated with greater detail in FIG. 3 which shows a set 40 of three converter stages that comprise a preceding converter stage 42, a present converter stage 44 and a succeeding converter stage 46 These three stages represent any three successive converter stages of the ADC system 20 of FIG. 1.

In its first operational phase, the present converter stage 44 of FIG. 3 converts an input data signal 47 (from the preceding converter stage) to a corresponding data digital code with this stage's ADC 48. As shown, the present converter stage has a first set 50 of first and second switched capacitors $C_1$ and $C_2$ that are arranged in this stage's first operational phase to receive the input data signal 47 and are arranged in this stage's succeeding second, operational phase to provide (with a stage amplifier 52) a succeeding input data signal 53 for the succeeding converter stage 46.

In particular, the capacitors $C_1$ and $C_2$ are arranged in the first operational phase to both receive a charge from the input data signal that is provided by the preceding converter stage 42. The capacitors $C_1$ and $C_2$ are then arranged in the second operational phase to have at least a portion of the charge in capacitor $C_1$ transferred to the capacitor $C_2$ which is coupled about the amplifier 52. The amount of charge transferred depends upon a decision signal $D_{data}V_{ref}$ that is supplied by this stage's DAC 56 which responds to the decisions of the ADC 48 concerning the input data signal (the response is indicated by a broken-line arrow through the DAC. 56). In one embodiment, the DAC 56 may comprise switches which respond to the ADC 48 by selectively coupling $-V_{ref}$, ground or $+V_{ref}$ to the first capacitor $C_1$.

The processes described above with respect to the present converter stage 44 are also performed by all other converter stages of FIG. 1 and, in particular, by the preceding converter stage 42 and the succeeding converter stage 44 of FIG. 3. Because the preceding converter stage 42 provides an input data signal 47 to the present converter stage 44, its first operational phase coincides in time with the second operational phase of the present converter stage and, similarly, its second operational phase coincides with the first operational phase of the present converter stage.

In like manner, the succeeding converter stage 46 receives the input data signal 53 from the preceding converter stage and provides an input data signal 57 so that its first and second operational phases also respectively coincide with the second and first operational phases of the present converter stage. In general, therefore, the first and second operational phases of any of the converter stages (e.g., the stage 44) are respectively coincident with the second and first operational phases of preceding and succeeding stages (e.g., the stages 42 and 46) as shown in FIG. 3.

The operations described above digitize the input data signals into corresponding data digital codes. Because the preceding and succeeding converter stages operate similarly to the preceding converter stage, their elements (ADC 48, amplifier 50, first and second sets 50 and 60 of capacitors and DAC 56) carry the same reference numbers in FIG. 3.

In accordance with a feature of the present invention, any selected converter stage, such as the preceding converter stage, 44 of FIG. 3, also arranges a second set 60 of third and fourth switched capacitors $C_3$ and $C_4$ to receive an input calibration signal 67 in this stage's second operational phase. In the succeeding first operational phase, the second set 60 is arranged to have the charge in the third capacitor $C_3$ transferred to the fourth capacitor $C_4$ and thereby provide a succeeding input calibration signal 73 for the succeeding converter stage 46. The amount of charge transferred depends upon a decision signal $S_{dec}$ that is applied to the third capacitor $C_3$. The receipt of an input calibration signal 67 and generation of a succeeding input calibration signal 73 is thus interleaved with receipt of an input data signal 47 and generation of a succeeding input data signal 53.

Attention is now directed to downstream converter stages 77 that are downstream from the selected converter stage 44. Each of these converter stages also includes a second set 60 of switched capacitors $C_3$ and $C_4$. Operations of the first downstream stage, i.e., the succeeding converter stage 46, are exemplary of the operations of all downstream stages. Accordingly, the following description is directed to the succeeding converter stage 46 but applies to all downstream converter stages.

In accordance with another feature of the invention, the succeeding converter stage 46 converts its input calibration signal 73 to a corresponding calibration digital code with its ADC 48. This conversion is realized in this stage's second operational phase. Also in this stage's second operational phase, its second set 60 of switched capacitors is arranged to receive the input calibration signal 73. In the subsequent first operational phase, the second set 60 of switched capacitors is arranged about this stage's amplifier 52 to provide an input calibration signal 75 for a succeeding converter stage. This input calibration signal is generated with the aid of a decision signal $D_{cal}V_{ref}$ that is supplied by this stage's DAC 56 which responds to the decisions of the ADC 48 concerning the input calibration signal (the response is indicated by a broken-line arrow through the DAC 56). This process continues in all converters of the downstream converter stages so that they provide a set of calibration digital codes. Essentially, the downstream converter stages digitize the input calibration signal 73 that is generated by the selected converter stage, i.e., the present converter stage 44 and this digitization produces the calibration digital codes of the downstream converter stages.

Just as the successive converter stages 24 of FIG. 1 successively digitize the input data signal provided by the sampler 22 and thereby form a collected data digital code, the downstream converter stages 77 of FIG. 3 interleavably digitize the input calibration signal 73 provided by the selected converter stage 44 to thereby form a collected calibration digital code. This calibration digital code can be compared to expected digital codes in the controller/corrector 26 of FIG. 1.

The calibration of the selected converter stage is facilitated by the fact that the downstream converter stages have no substantial error. This is the case because they, for example, have been previously calibrated or because, for a second example, their error can be ignored since they are digitizing the least significant bits.

Now the preceding converter stage 42 of FIG. 3 becomes the selected stage and the interleaved processes shown above are repeated. This continues until the processing of the present converter stage 44 and all preceding converter stages have been calibrated (wherein that processing is conducted with each stage's second set 60 of capacitors). The second sets 60 of capacitors can now be exchanged with the first sets 50 of capacitors so that the selected converter stage and all preceding converter stages are operating in a calibrated mode.

At a subsequent time, the MDACs of the converter stages may become suspect because of various effects (e.g., temperature change or aging). The interleaved processes shown above can then be repeated to calibrate the present converter stage 44 and all preceding converter stages when they are processing calibration signals with their first sets 50 of capacitors. Once that calibration is complete, the first sets 50 are then exchanged with the second sets 60.

In an alternate calibration method, the current converter stage 44 is next calibrated with its first set 50 of capacitors so that it has been calibrated with both sets 50 and 60. The sets are then exchanged so that the calibrated third and fourth capacitors $C_3$ and $C_4$ are now digitizing input data signals and the first and second capacitors $C_1$ and $C_2$ are generating an input calibration signal for the succeeding converter stage. Now the calibration process proceeds to the preceding converter stage.

In either case, all calibrated stages are now digitizing input data signals with their second sets of capacitors. At a subsequent time, the second sets may become suspect because of various effects (e.g., temperature change or aging). The interleaved processes shown above can then be repeated to calibrate the stages with their first sets 50 of capacitors which are then exchanged with their second sets 60.

Attention is now directed to different embodiments of the input calibration signal 67 and the decision signal $S_{dec}$ in the present converter stage 44. An understanding of these embodiments is facilitated by the diagram 80 of FIG. 4 which illustrates a transfer function 83 of the MDAC of an exemplary 1.5-bit converter stage. The horizontal axis 81 indicates input signals are accepted between $-V_{ref}$ and $+V_{ref}$ and the vertical axis 82 indicates that MDAC output signals also range between $-V_{ref}$ and $+V_{ref}$.

In this 1.5-bit stage, the first and second capacitors have equal capacitance so that the electrical charge in the second capacitor doubles when the charge of the first capacitor is transferred to the second capacitor. Accordingly the slope of the transfer function 83 in FIG. 3 is two.

The associated ADC (e.g., the ADC 48 in FIG. 3) outputs digital codes 00, 01 and 10 when the input data signal is respectively between $-V_{ref}$ and $-0.25$ $V_{ref}$, between $-0.25$ $V_{ref}$ and $+0.25$ $V_{ref}$, and between $+0.25$ $V_{ref}$ and $+V_{ref}$. Decision thresholds between these regions are thus at $-0.25$ $V_{ref}$ and $+0.25$ $V_{ref}$. The associated DAC (e.g., DAC 56 in FIG. 3) provides decision signals of $+V_{ref}$, 0 and $-V_{ref}$ for these regions (i.e., $D_{data}$ in FIG. 3 can be $+1$, 0 or $-1$). These decision signals shift the transfer function 83 upwards for input data signals from $V_{ref}$ to $-0.25$ $V_{ref}$ and shift it downward for input data signals from $+0.25$ $V_{ref}$ to $+V_{ref}$. It is apparent that gain errors will introduce slope errors into the transfer function 83 and DAC errors will introduce offset errors into the transfer function.

In one calibration embodiment, the input calibration signal 67 of FIG. 3 is narrowly spaced from a decision threshold. For example, the input calibration signal can be spaced above the threshold of $-0.25$ $V_{ref}$ as indicated by input arrow 84 in FIG. 4. The decision signal $S_{dec}$ of the present converter stage 44 of FIG. 3 is then alternated between different values. For example, it is alternated between $+1$ and zero which causes the input calibration signal 73 of FIG. 3 to transition across a step 85 in FIG. 4 if there are no MDAC errors. A different jump will occur if there are MDAC errors. A broken-line extension 86 of the transfer function 83 has been added in FIG. 4 to aid in defining the step 85.

In the controller/corrector 26 of FIG. 1, the calibration digital codes of the downstream converter stages (77 in FIG. 3) are subtracted and compared to the calibration digital codes that describe the expected step 85. The difference provides a calibration coefficient associated with the second set 60 of capacitors.

Figure 4:
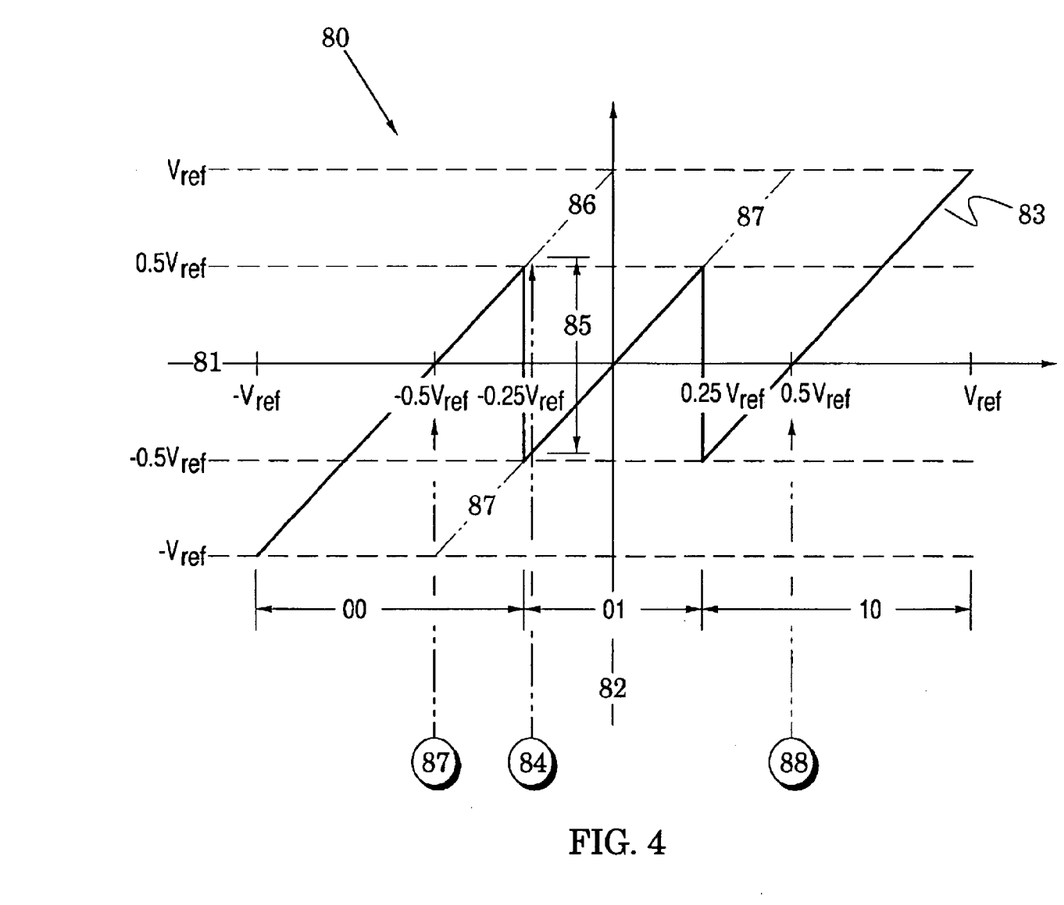
FIG. 4 is a diagram of the transfer function of the present converter stage in FIG. 3 wherein the diagram illustrates various calibration methods of the invention.

Preferably, the input calibration signal 67 of FIG. 3 is narrowly spaced from a decision threshold as indicated by input arrow 84 in FIG. 4 so that the step 85 in FIG. 4 is approximately midscale. Different input calibration signals can be used. That is, the input arrow 84 can be further spaced from the decision threshold. If the spacing is too large, however, the step 85 will abut $-V_{ref}$ or $+V_{ref}$ which may complicate signal processing.

In another calibration embodiment, opposite-polarity input calibration signals (67 in FIG. 3) are simultaneously applied to different capacitors of the second set 60, i.e., to the third and fourth capacitors $C_3$ and $C_4$. At the same time a null decision signal is applied, i.e., $S_{dec}$ in FIG. 3 is set to zero. For example, $-V_{ref}$ is applied to the third capacitor and $+V_{ref}$ is applied to the fourth capacitor. If the capacitors are matched, the signal across the fourth capacitor will be nulled so that the input data signal 53 in FIG. 3 will be zero. If the capacitors are not matched, the signal across the fourth capacitor will differ from zero and the input data signal 53 in FIG. 3 will reflect this difference.

The calibration digital codes of the downstream converter stages indicate this difference and can be used in the controller/corrector 26 of FIG. 1 as a calibration coefficient associated with the second set 60 of third and fourth capacitors $C_3$ and $C_4$. Although described with reference to capacitor matching, this method will provide a calibration coefficient for any source of MDAC error. Although other opposite-polarity input calibration signals can be simultaneously applied to the third and fourth capacitors, the voltages $-V_{ref}$ and $+V_{ref}$ are preferably used because highly accurate samples of these are generally available in MDAC structures.

In yet another calibration embodiment, a null decision signal ($S_{dec}$) is applied to the present converter stage 44 and opposite-polarity input calibration signals (67 in FIG. 3) are successively applied to both capacitors of the second set 60. For example, $+0.5V_{ref}$ can be initially applied to the third and fourth capacitors $C_3$ and $C_4$ and in a successive phase, $+0.5V_{ref}$ is applied as indicated by input arrows 87 and 88 in FIG. 4. If there are no MDAC errors, the input calibration signal 73 of FIG. 3 (for the succeeding converter stage) will be $-V_{ref}$ and $+V_{ref}$ respectively. If not, the input calibration signal will differ in the two phases. Subtracting the calibration digital codes of the downstream converter stages that are obtained in the two phases will provide a calibration coefficient in controller/corrector 26 of FIG. 1 that substantially eliminates the MDAC error. Various other voltages can be successively applied to both capacitors with the resulting difference compared to an expected difference.

Many other combinations of input calibration signals and decision signals can be devised that use the teachings of the invention to obtain calibration coefficients that effectively correct MDAC errors.

Figure 5:
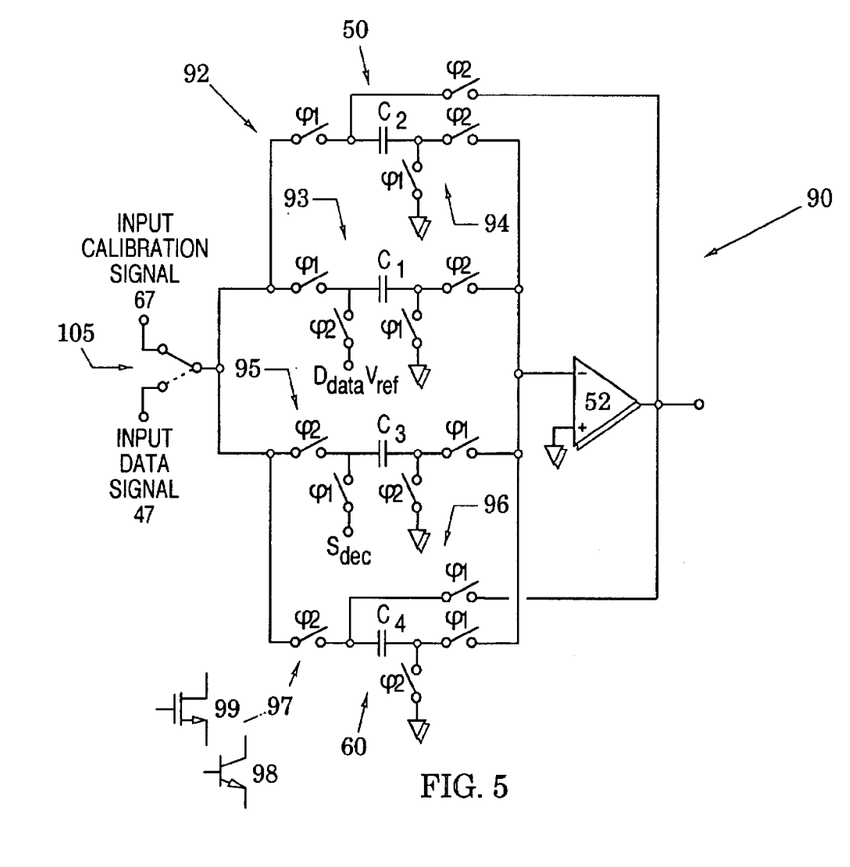
FIG. 5 is a schematic of an exemplary converter stage for use in the system of FIG. 1.

FIG. 5 illustrates an exemplary MDAC structure 90 for use in the converter stages of FIG. 3. The structure repeats the first and second sets 50 and 60 of capacitors and the amplifier 52 that are shown in FIG. 3 and also provides a switch network 92 which realizes the first and second operational phases of FIG. 3. This switch network is described below with reference to its functions in the succeeding converter stage of FIG. 3 (and in all of the other downstream converter stages). The switches are all shown in an open state in FIG. 5 and the following description is directed to their function when they are altered to a closed state.

The switch network 92 includes a group 93 of four switches that are arranged to couple the first capacitor $C_1$ between the input data signal and ground in a first operational phase $\phi 1$ and between the data decision signal $D_{data}$-$V_{ref}$ and the inverting input of the amplifier 52 in a second operational phase $\phi 2$. The switch network 92 also includes a group 94 of four switches that are arranged to couple the second capacitor $C_2$ between the input data signal and ground in a first operational phase $\phi 1$ and across the amplifier 52 in a second operational phase $\phi 2$.

The switch network 92 further includes a group 95 of four switches that are arranged to couple the third capacitor $C_3$ between the calibration decision signal $D_{Cal}V_{ref}$ and the inverting input of the amplifier 52 in the first operational phase $\phi 1$ and between the input calibration signal and ground in the second operational phase $\phi 2$. Finally, the switch network includes a group 96 of four switches that are arranged to couple the fourth capacitor $C_4$ across the amplifier 52 in the first operational phase $\phi 1$ and between the input calibration signal and ground in the second operational phase $\phi 2$. As indicated by substitution arrow 97, the switches are preferably realized with transistors such as the bipolar junction transistor 97 or the metal-oxide-semiconductor (MOS) transistor 98.

Figure 6:
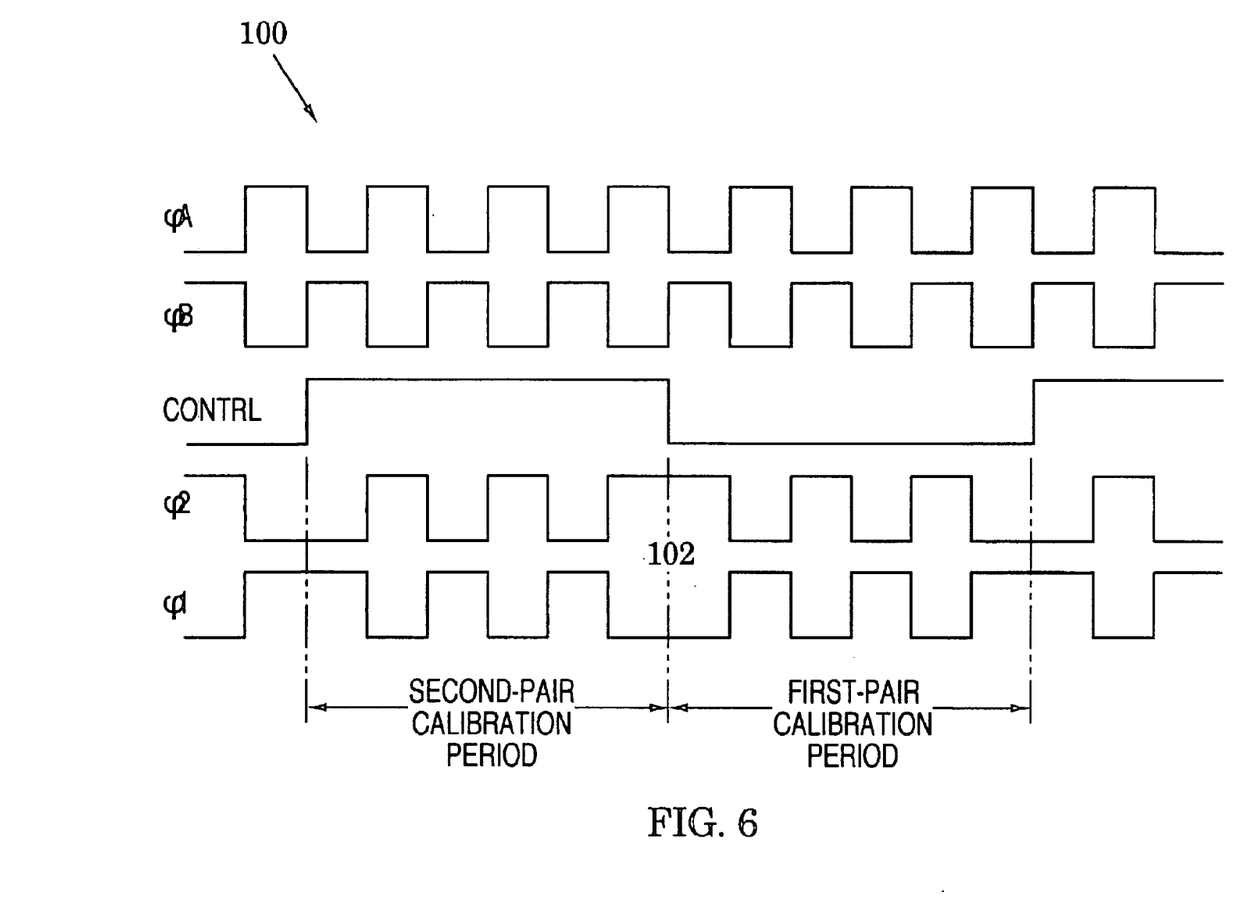
FIG. 6 is a timing diagram that illustrates clock signals for use with the converter stage of FIG. 5.

FIG. 6 illustrates a timing diagram 100 that is suitable for use with the switch network 92 of FIG. 5. FIG. 6 shows a clock $\phi A$ and an opposite clock $\phi B$. When clock $\phi A$ is high, it couples the first set 50 of first and second capacitors $C_1$ and $C_2$ of the preceding and succeeding converter stages 42 and 46 in their first operational phases that are shown in FIG. 3. When clock $\phi B$ is high, it couples the first set 50 in their second operational phases.

The timing diagram 100 also shows clocks $\phi 1$ and $\phi 2$. It is noted that when the $\phi 1$ switches of FIG. 5 close in response to the high portions of the clock $\phi 1$, they cause the MDAC structure 90 to realize the first operational phase of the present converter stage 44 of FIG. 3. It is further noted that when the $\phi 2$ switches of FIG. 5 close in response to the high portions of the clock $\phi 2$, they cause the MDAC structure 90 to realize the second operational phase of the present converter stage 44 of FIG. 3. Essentially, changing from clock $\phi 1$ to clock $\phi 2$ exchanges the first and second sets of capacitors. The clock signals $\phi A$, $\phi B$, $\phi 1$ and $\phi 2$ are provided by a clock generator 101 which may be in or associated with the controller/corrector 26 of FIG. 1.

During the second-pair calibration period of FIG. 6, a high control signal commands the clocks $\phi 1$ and $\phi 2$ to be respectively in phase with the clocks $\phi B$ and $\phi A$. The first and second sets of capacitors are thus arranged as shown in the first and second operational phases of the present converter stage 44 of FIG. 3. The second set 60 can be calibrated in this arrangement. During the subsequent first-pair calibration period of FIG. 6, a low control signal shifts the clocks $\phi 1$ and $\phi 2$ are so that they are respectively in phase with the clocks $\phi A$ and $\phi B$. This exchanges the first and second sets 50 and 60 of capacitors in the first and second operational phases of the present converter stage 44 of FIG. 3. In this arrangement, the stage can be calibrated with its first set 50 of capacitors.

At the intersection 102 between the second-pair calibration period and the first-pair calibration period in FIG. 6, the $\phi 2$ clock repeats a high portion and the $\phi 1$ clock repeats a low portion. Accordingly, the second pair. 60 of switches receives the input calibration signal 67 (as shown in the first operational phase of FIG. 3) at the end of the second-pair calibration period of FIG. 6 and then receives the input data signal 47 to begin the first-pair calibration period. The repeat in the φ1 clock complements this repeat to place it in phase with the φA clock.

A routing switch 105 is preferably added in FIG. 5 to facilitate switching in the present converter stage 44 of FIG. 3. During the second-pair calibration period of FIG. 6, the second set 60 of third and fourth capacitors $C_3$ and $C_4$ are switched to receive an input calibration signal 67 in a second operational phase and the first set 50 of first and second capacitors $C_1$ and $C_2$ are switched to receive an input data signal 47 in a succeeding first operational phase. The routing switch 105 is shown to have a solid-line position in which it can provide the input calibration signal 67 and in: a broken-line position in which it can provide the input data signal 47. The routing switch is not needed in the downstream converter stages 77 of FIG. 3.

To evaluate the methods and structures of the invention, a 14-bit, 200 megasample per second pipelined ADC with 1.5-bit converter stages was simulated with an assumed 0.5% capacitor mismatch in the converter stages. Prior to calibration, the ADC provided a signal to noise and distortion ratio (SINAD) of 62 dB and a spurious-free dynamic range (SFDR) of 67 dB. After calibration of the initial eight converter stages in accordance with the present invention, the ADC provided a substantially-enhanced SINAD of 82 dB and a substantially-enhanced SFDR of 108 dB.

As mentioned previously, the calibration methods and structures of the invention provide for the interleaved calibration and subsequent correction of MDAC errors in switched-capacitor converter stages that would otherwise introduce nonlinear performance into pipelined ADC systems. Although capacitor mismatch and finite amplifier gain are generally the principal sources of MDAC gain errors, the benefits of the invention apply to all MDAC errors (e.g., gain errors and DAC errors). In passing, it is noted that the transfer function (83 in FIG. 3) of the converter stages provides redundancy which the controller/corrector 26 of FIG. 1 uses to correct errors made by the ADCs of pipelined converter stages (e.g., the ADCs 48 of FIG. 3.

The interleaved calibration can be run continuously or at selected times without disturbing the ongoing processing of input data signals. It thus counters various effects (e.g., element aging and temperature changes) that otherwise degrade converter accuracy. The calibration generally begins with an initially-selected converter stage associated with a less significant bit and then successively progresses to more-significant-bit converter stages. The downstream converter stages (as shown in FIG. 3) have either been previously calibrated or are considered accurate since they are associated with the least significant bits.

These calibration methods are preferably repeated several times (e.g., numerous calibration coefficients can be gathered and then averaged) to minimize degrading effects of various sources (e.g., circuit noise). Operational exchanges between sets of capacitors is preferably conducted randomly to avoid introduction of spurious signals due to repetitive exchanges. Because data and calibration are interleavably conducted with the same converter stages, the invention does not require added stages for calibration.

For simplicity of illustration, the calibration methods and structures have been described with reference to single-ended stage structures but their application to differential stage structures is also intended and is obvious to those skilled in the converter art. Although the calibration methods and structures have been described with reference to 1.5 bit converter stages, they are equivalently applicable to any switched-capacitor converter stage.

For example, they also apply to a 1.5-bit converter stage in which the capacitor of FIG. 3 is always coupled across the amplifier 52. More generally, they apply to n-bit converter stages in which n exceeds 1.5 and which therefore generally replace the first capacitor $C_1$ of FIG. 3 with a plurality of capacitors. There are many other switched-capacitor configurations which can all be modified in accordance with the invention.

Although the calibration methods and structures of the invention have been described with reference to first and second sets of capacitors, they are equivalently applicable to additional sets. For example, a third set of capacitors can be added so that at any given time, one pair is processing input data signals, one pair is interleavably processing input calibration signals and one pair is idle. Although this embodiment adds additional structure, it may simplify the switch clocking.

The calibration methods and structures produce calibration coefficients which are preferably introduced in the digital domain without affecting the normal flow or speed of input data signals through the converter stages. This introduction is performed by the controller/corrector 26 of FIG. 1 which may be realized with discrete elements, with arrays of logic gates and/or with an appropriately-programmed digital processor. The term processor is intended to embrace these and other realizations.

For clarity of description, the operation of all converter stages of the ADC 20 have been considered to be identical. As is obvious, however, the final converter stage need not generate an input data signal nor a calibration data signal for a succeeding converter stage since there is none.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. In an analog-to-digital converter having successive converter stages, a method of converting data signals and calibrating at least one converter stage, the method comprising the steps of:

with first sets of switched capacitors, processing data signals through said converter stages to provide corresponding data digital codes;

with a second set of switched capacitors in a selected one of said converter stages, generating an initial calibration signal interleavably with said data signals;

with second sets of switched capacitors in downstream converter stages that are downstream from said selected converter stage and in response to said initial calibration signal, processing downstream calibration signals interleavably with said data signals to provide corresponding calibration digital codes;

with said second sets of switched capacitors in said selected and downstream converter stages, subsequently processing data signals through said converter stages to provide corresponding subsequent data digital codes; and correcting said subsequent data digital codes in accordance with said calibration digital codes.

2. In an analog-to-digital converter having successive converter stages, a method of converting data signals and calibrating at least one converter stage, the method comprising the steps of:

with first sets of switched capacitors, processing data signals through said converter stages to provide corresponding data digital codes;

with a second set of switched capacitors in a selected one of said converter stages, generating an initial calibration signal interleavably with said data signals;

with second sets of switched capacitors in downstream converter stages that are downstream from said selected converter stage and in response to said initial calibration signal, processing downstream calibration signals interleavably with said data signals to provide corresponding calibration digital codes; and further including the step of subsequently exchanging said first and second sets of switched capacitors in said selected converter stage.

3. The method of claim 2, further including the step of obtaining, from said calibration digital codes, calibration coefficients for said selected converter stage that correspond to its second set of switched capacitors.

4. The method of claim 3, wherein said obtaining step includes the steps of comparing said calibration digital codes to expected digital codes to thereby generate said calibration coefficients.

5. The method of claim 3, further including the step of storing said calibration coefficients.

6. The method of claim 3, further including the step of successively repeating said generating and said downstream calibration signals processing step for converter stages that preceed said selected converter stage.

7. In an analog-to-digital converter having successive converter stages, a method of converting data signals and calibrating at least one converter stage, the method comprising the steps of:

with first sets of switched capacitors, processing data signals through said converter stages to provide corresponding data digital codes;

with a second set of switched capacitors in a selected one of said converter stages, generating an initial calibration signal interleavably with said data signals; and with second sets of switched capacitors in downstream converter stages that are downstream from said selected converter stage and in response to said initial calibration signal, processing downstream calibration signals interleavably with said data signals to provide corresponding calibration digital codes;

further including the step of subsequently exchanging said first and second sets of switched capacitors in said selected converter stage;

and further including the step of executing said exchanging step on a random basis.

8. The method of claim 7, further including the step of continuously executing said generating and said downstream calibration signals processing step for said selected converter stage and for converter stages that preceed said selected converter stage.

9. In an analog-to-digital converter having successive converter stages, a method of interleavably converting data signals to corresponding data digital codes and calibrating at least one converter stage, the method comprising the steps of:

in each of said converter stages,
a) converting an input data signal to a corresponding data digital code in a first operational phase of that converter stage; and
b) arranging a first set of switched capacitors to receive said input data signal in said first operational phase and to provide, in a succeeding second operational phase of that converter stage, a succeeding input data signal for a succeeding converter stage, whereby the first and second operational phases of any one of said converter stages are respectively coincident with the second and first operational phases of an adjacent one of said converter stages;

in a selected one of said converter stages, arranging a second set of switched capacitors to receive an input calibration signal in said second operational phase and to provide a succeeding input calibration signal for a succeeding converter stage in said first operational phase;

in at least one of downstream converter stages that succeed said selected converter stage,
a) converting an input calibration signal to a corresponding calibration digital code in said second operational phase; and
b) arranging a second set of switched capacitors to receive said input calibration signal in said second operational phase and to provide an input calibration signal for a succeeding converter stage in said first operational phase; and from calibration digital codes of said downstream converter stages, obtaining calibration coefficients for said selected converter stage that correspond to its second set of switched capacitors; and in said selected converter stage, subsequently exchanging said second and first sets of switched capacitors so that said second set of switched capacitors receives said input data signal in said first operational phase and provides a succeeding input data signal in a succeeding second operational phase.

10. The method of claim 9, further including the step of narrowly spacing said input calibration signal of said selected converter stage from an input threshold of said selected converter stage in said second operational phase.

11. The method of claim 9, wherein:

said second-set arranging step of said selected converter stage includes the step of applying opposite-polarity input calibration signals to different capacitors of said second set in said second operational phase; and said obtaining step includes the step of setting said calibration coefficients equal to the calibration digital codes of said downstream converter stages.

12. The method of claim 9, wherein:

said first-set arranging step includes the step of applying, to at least one capacitor of said first set, a data decision signal that corresponds to said data digital code; and said second-set arranging step of said downstream converter stages includes the step of applying, to at least one capacitor of said second set, a calibration decision signal that corresponds to said calibration digital code.

13. The method of claim 9, wherein:

said first-set arranging step includes the step of switching at least one capacitor of said first set about an amplifier to facilitate provision of said input data signal for said succeeding converter stage; and said second-set arranging step of said selected converter stage and said downstream converter stages includes the step of switching at least one capacitor of said second set about said amplifier to facilitate provision of said input calibration signal for said succeeding converter stage.

14. In an analog-to-digital converter having successive converter stages, a method of interleavably converting data signals to corresponding data digital codes and calibrating at least one converter stage, the method comprising the steps of:

in each of said converter stages,
  a) converting an input data signal to a corresponding data digital code in a first operational phase of that converter stage; and
  b) arranging a first set of switched capacitors to receive said input data signal in said first operational phase and to provide, in a succeeding second operational phase of that converter stage, a succeeding input data signal for a succeeding converter stage, whereby the first and second operational phases of any one of said converter stages are respectively coincident with the second and first operational phases of an adjacent one of said converter stages;
in a selected one of said converter stages, arranging a second set of switched capacitors to receive an input calibration signal in said second operational phase and to provide a succeeding input calibration signal for a succeeding converter stage in said first operational phase; and
in at least one of downstream converter stages that succeed said selected converter stage,
  a) converting an input calibration signal to a corresponding calibration digital code in said second operational phase; and
  b) arranging a second set of switched capacitors to receive said input calibration signal in said second operational phase and to provide an input calibration signal for a succeeding converter stage in said first operational phase; and
from calibration digital codes of said downstream converter stages, obtaining calibration coefficients for said selected converter stage that correspond to its second set of switched capacitors;
and further including the steps in said selected converter stage of:
exchanging said first and second sets subsequent to said obtaining step; and
providing the input data signal of the succeeding converter stage with said second set.

15. The method of claim 14, wherein said obtaining step includes the steps of comparing the calibration digital codes of said downstream converter stages to expected digital codes to thereby generate said calibration coefficients.

16. In an analog-to-digital converter having successive converter stages, a method of interleavably converting data signals to corresponding data digital codes and calibrating at least one converter stage, the method comprising the steps of:
in each of said converter stages,
  a) converting an input data signal to a corresponding data digital code in a first operational phase of that converter stage; and
  b) arranging a first set of switched capacitors to receive said input data signal in said first operational phase and to provide, in a succeeding second operational phase of that converter stage, a succeeding input data signal for a succeeding converter stage, whereby the first and second operational phases of any one of said converter stages are respectively coincident with the second and first operational phases of an adjacent one of said converter stages;
in a selected one of said converter stages, arranging a second set of switched capacitors to receive an input calibration signal in said second operational phase and to provide a succeeding input calibration signal for a succeeding converter stage in said first operational phase; and
in at least one of downstream converter stages that succeed said selected converter stage,
  a) converting an input calibration signal to a corresponding calibration digital code in said second operational phase; and
  b) arranging a second set of switched capacitors to receive said input calibration signal in said second operational phase and to provide an input calibration signal for a succeeding converter stage in said first operational phase; and
from calibration digital codes of said downstream converter stages, obtaining calibration coefficients for said selected converter stage that correspond to its second set of switched capacitors;
wherein said second-set arranging step of said selected converter stage includes the step of successively applying different decision signals to at least one capacitor of said second set in said first operational phase to thereby generate a difference in the calibration digital codes of said downstream converter stages; and
said obtaining step includes the step of comparing said difference to a predetermined difference.

17. In an analog-to-digital converter having successive converter stages, a method of interleavably converting data signals to corresponding data digital codes and calibrating at least one converter stage, the method comprising the steps of:
in each of said converter stages,
  a) converting an input data signal to a corresponding data digital code in a first operational phase of that converter stage; and
  b) arranging a first set of switched capacitors to receive said input data signal in said first operational phase and to provide, in a succeeding second operational phase of that converter stage, a succeeding input data signal for a succeeding converter stage, whereby the first and second operational phases of any one of said converter stages are respectively coincident with the second and first operational phases of an adjacent one of said converter stages;
in a selected one of said converter stages, arranging a second set of switched capacitors to receive an input calibration signal in said second operational phase and to provide a succeeding input calibration signal for a succeeding converter stage in said first operational phase; and
in at least one of downstream converter stages that succeed said selected converter stage,
  a) converting an input calibration signal to a corresponding calibration digital code in said second operational phase; and
  b) arranging a second set of switched capacitors to receive said input calibration signal in said second operational phase and to provide an input calibration signal for a succeeding converter stage in said first operational phase; and
from calibration digital codes of said downstream converter stages, obtaining calibration coefficients for said selected converter stage that correspond to its second set of switched capacitors;
and further including the step of applying a null decision signal to at least one capacitor of the second set of said selected converter stage in said first operational phase.

18. In an analog-to-digital converter having successive converter stages, a method of interleavably converting data signals to corresponding data digital codes and calibrating at least one converter stage, the method comprising the steps of:
in each of said converter stages,
  a) converting an input data signal to a corresponding data digital code in a first operational phase of that converter stage; and b) arranging a first set of switched capacitors to receive said input data signal in said first operational phase and to provide, in a succeeding second operational phase of that converter stage, a succeeding input data signal for a succeeding converter stage, whereby the first and second operational phases of any one of said converter stages are respectively coincident with the second and first operational phases of an adjacent one of said converter stages;

in a selected one of said converter stages, arranging a second set of switched capacitors to receive an input calibration signal in said second operational phase and to provide a succeeding input calibration signal for a succeeding converter stage in said first operational phase; and in at least one of downstream converter stages that succeed said selected converter stage,
  a) converting an input calibration signal to a corresponding calibration digital code in said second operational phase; and
  b) arranging a second set of switched capacitors to receive said input calibration signal in said second operational phase and to provide an input calibration signal for a succeeding converter stage in said first operational phase; and from calibration digital codes of said downstream converter stages, obtaining calibration coefficients for said selected converter stage that correspond to its second set of switched capacitors;

wherein said second-set arranging step of said selected converter stage includes the steps of:
  a) applying a null decision signal to at least one capacitor of said second set in said first operational phase; and
  b) successively applying opposite-polarity input calibration signals to the capacitors of said second set in said second operational phase to thereby provide a difference in the calibration digital codes of said downstream converter stages; and said obtaining step includes the step of comparing said difference to a predetermined difference.

19. An analog-to-digital converter system that interleavably converts data signals to corresponding data digital codes and calibrates at least one converter stage, the system comprising:

a plurality of converter stages which each include:
  a) an analog-to-digital converter that, in response to an input data signal, provides a corresponding data digital code in a first operational phase of that converter stage;
  b) a first set of switched capacitors arranged to receive said input data signal in said first operational phase and to provide an input data signal for a succeeding converter stage in a succeeding second operational phase of that converter stage;

in a selected one of said converter stages, a second set of switched capacitors arranged to receive an input calibration signal in said second operational phase and to provide an input calibration signal for a succeeding converter stage in said first operational phase; and in at least one of downstream converter stages that succeed said selected converter stage, a second set of switched capacitors arranged to receive said input calibration signal in said second operational phase and to provide an input calibration signal for a succeeding converter stage in said first operational phase wherein the analog-to-digital converter of each of said downstream converter stages converts an input calibration signal to a corresponding calibration digital code in said second operational phase;

a switch network associated with said selected converter stage; and a processor configured to obtain, from calibration digital codes of said downstream converter stages, calibration coefficients for said selected converter stage that correspond to its second set of switched capacitors and further configured to command said switch network to exchange said first and second sets of switched capacitors in said selected converter stage.

20. The system of claim 19, wherein said controller:
applies opposite-polarity input calibration signals to different capacitors of the second set of said selected converter stage in said second operational phase; and
sets said calibration coefficients equal to the calibration digital codes of said downstream converter stages.

21. The system of claim 19, wherein each of said converter stages includes a digital-to-analog converter that:
in said second operational phase, applies a data decision signal to at least one capacitor of said first set that corresponds to said data digital code; and
in said first operational phase, applies to at least one capacitor of said second set of said downstream converter stages a calibration decision signal that corresponds to said calibration digital code.

22. The system of claim 19, wherein:
each of said converter stages includes an amplifier; and
said controller:
  a) switches at least one capacitor of said first set about said amplifier to facilitate provision of said input data signal for said succeeding converter stage; and
  b) switches at least one capacitor of said second set about said amplifier to facilitate provision of said input calibration signal for said succeeding converter stage.

23. An analog-to-digital converter system that interleavably converts data signals to corresponding data digital codes and calibrates at least one converter stage, the system comprising:

a plurality of converter stages which each include:
  a) an analog-to-digital converter that, in response to an input data signal, provides a corresponding data digital code in a first operational phase of that converter stage;
  b) a first set of switched capacitors arranged to receive said input data signal in said first operational phase and to provide an input data signal for a succeeding converter stage in a succeeding second operational phase of that converter stage;

in a selected one of said converter stages a second set of switched capacitors arranged to receive an input calibration signal in said second operational phase and to provide an input calibration signal for a succeeding converter stage in said first operational phase; and in at least one of downstream converter stages that succeed said selected converter stage, a second set of switched capacitors arranged to receive said input calibration signal in said second operational phase and to provide an input calibration signal for a succeeding converter stage in said first operational phase wherein the analog-to-digital converter of each of said downstream converter stages converts an input calibration signal to a corresponding calibration digital code in said second operational phase; and a processor configured to obtain, from calibration digital codes of said downstream converter stages, calibration coefficients for said selected converter stage that correspond to its second set of switched capacitors;

and further including a clock generator that provides clock signals to said first and second sets and wherein said processor is configured to:

command changes in said clock signals that exchange said first and second sets in said selected converter stage; and alter said data digital code in accordance with said calibration coefficients.

24. The system of claim 23, further including a processor and wherein each of said converter stages includes a switch network that responds to said controller to thereby arrange said first and second sets of capacitors in said first and second operational phases.

25. An analog-to-digital converter system that interleavably converts data signals to corresponding data digital codes and calibrates at least one converter stage, the system comprising:

a plurality of converter stages which each include:
  a) an analog-to-digital converter that, in response to an input data signal, provides a corresponding data digital code in a first operational phase of that converter stage;
  b) a first set of switched capacitors arranged to receive said input data signal in said first operational phase and to provide an input data signal for a succeeding converter stage in a succeeding second operational phase of that converter stage;

in a selected one of said converter stages, a second set of switched capacitors arranged to receive an input calibration signal in said second operational phase and to provide an input calibration signal for a succeeding converter stage in said first operational phase; and in at least one of downstream converter stages that succeed said selected converter stage, a second set of switched capacitors arranged to receive said input calibration signal in said second operational phase and to provide an input calibration signal for a succeeding converter stage in said first operational phase wherein the analog-to-digital converter of each of said downstream converter stages converts an input calibration signal to a corresponding calibration digital code in said second operational phase; and a processor configured to obtain, from calibration digital codes of said downstream converter stages, calibration coefficients for said selected converter stage that correspond to its second set of switched capacitors;

wherein:

said selected converter stage includes a digital-to-analog converter that generates decision signals;

and said controller:
  a) commands said digital-to-analog converter to apply different decision signals to at least one capacitor of said second set in said first operational phase to thereby generate a difference in the calibration digital codes of said downstream converter stages; and
  b) compares said difference to a predetermined difference.

26. The system of claim 25, wherein said controller narrowly spaces said input calibration signal of said selected converter stage from an input threshold of said selected converter stage in said second operational phase.

27. An analog-to-digital converter system that interleavably converts data signals to corresponding data digital codes and calibrates at least one converter stage, the system comprising:

a plurality of converter stages which each include:
  a) an analog-to-digital converter that, in response to an input data signal, provides a corresponding data digital code in a first operational phase of that converter stage;
  b) a first set of switched capacitors arranged to receive said input data signal in said first operational phase and to provide an input data signal for a succeeding converter stage in a succeeding second operational phase of that converter stage;

in a selected one of said converter stages, a second set of switched capacitors arranged to receive an input calibration signal in said second operational phase and to provide an input calibration signal for a succeeding converter stage in said first operational phase; and in at least one of downstream converter stages that succeed said selected converter stage, a second set of switched capacitors arranged to receive said input calibration signal in said second operational phase and to provide an input calibration signal for a succeeding converter stage in said first operational phase wherein the analog-to-digital converter of each of said downstream converter stages converts an input calibration signal to a corresponding calibration digital code in said second operational phase; and a processor configured to obtain, from calibration digital codes of said downstream converter stages calibration coefficients for said selected converter stage that correspond to its second set of switched capacitors;

wherein said controller applies a null decision signal to at least one capacitor of least one capacitor of the second set of said selected converter stage in said first operational phase.

28. An analog-to-digital converter system that interleavably converts data signals to corresponding data digital codes and calibrates at least one converter stage, the system comprising:

a plurality of converter stages which each include:
  a) an analog-to-digital converter that, in response to an input data signal, provides a corresponding data digital code in a first operational phase of that converter stage;
  b) a first set of switched capacitors arranged to receive said input data signal in said first operational phase and to provide an input data signal for a succeeding converter stage in a succeeding second operational phase of that converter stage;

in a selected one of said converter stages, a second set of switched capacitors arranged to receive an input calibration signal in said second operational phase and to provide an input calibration signal for a succeeding converter stage in said first operational phase; and in at least one of downstream converter stages that succeed said selected converter stage, a second set of switched capacitors arranged to receive said input calibration signal in said second operational phase and to provide an input calibration signal for a succeeding converter stage in said first operational phase wherein the analog-to-digital converter of each of said downstream converter stages converts an input calibration signal to a corresponding calibration digital code in said second operational phase; and a processor configured to obtain, from calibration digital codes of said downstream converter stages, calibration coefficients for said selected converter stage that correspond to its second set of switched capacitors;

wherein said controller:

applies a null decision signal to at least one capacitor of the second set of said selected converter stage in said first operational phase;

successively applies opposite-polarity input calibration signals to the capacitors of the second set of said selected converter stage in said second operational phase to thereby provide a difference in the calibration digital codes of said downstream converter stages; and compares said difference to a predetermined difference.

* * * * *